(12) United States Patent
Fan et al.

(10) Patent No.: US 10,832,961 B1
(45) Date of Patent: Nov. 10, 2020

(54) SACRIFICIAL GATE SPACER REGIONS FOR GATE CONTACTS FORMED OVER THE ACTIVE REGION OF A TRANSISTOR

(71) Applicant: International Business Machines Corporation, Armonk, NY (US)

(72) Inventors: Su Chen Fan, Cohoes, NY (US); Ruilong Xie, Schenectady, NY (US); Veeraraghavan S. Basker, Schenectady, NY (US); Andre P. Labonte, Mechanicville, NY (US); Chanro Park, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/390,226

(22) Filed: Apr. 22, 2019

(51) Int. Cl.
| | |
|---|---|
| *H01L 21/8234* | (2006.01) |
| *H01L 29/66* | (2006.01) |
| *H01L 29/78* | (2006.01) |
| *H01L 27/088* | (2006.01) |
| *H01L 29/16* | (2006.01) |

(52) U.S. Cl.
CPC ........... *H01L 21/823468* (2013.01); *H01L 21/823431* (2013.01); *H01L 21/823437* (2013.01); *H01L 21/823475* (2013.01); *H01L 27/0886* (2013.01); *H01L 29/16* (2013.01); *H01L 29/6653* (2013.01); *H01L 29/66795* (2013.01); *H01L 29/785* (2013.01)

(58) Field of Classification Search
CPC ..... H01L 21/823431; H01L 21/823821; H01L 21/845; H01L 29/66795–66818; H01L 29/41791; H01L 29/785–786; H01L 2029/7857–7858; H01L 27/0886; H01L 27/0924; H01L 27/10826; H01L 27/10879; H01L 27/1211
See application file for complete search history.

(56) References Cited

U.S. PATENT DOCUMENTS

| | | | |
|---|---|---|---|
| 6,787,425 | B1 | 9/2004 | Rotondaro et al. |
| 7,109,102 | B2 | 9/2006 | Bohr |
| 9,461,143 | B2 | 10/2016 | Pethe et al. |
| 2017/0278752 | A1 | 9/2017 | Ryckaert et al. |
| 2017/0309569 | A1 | 10/2017 | Azmat et al. |
| 2018/0122919 | A1 | 5/2018 | Park et al. |
| 2018/0151433 | A1 | 5/2018 | Fan et al. |

(Continued)

*Primary Examiner* — Sonya McCall-Shepard
(74) *Attorney, Agent, or Firm* — Cantor Colburn LLP; Joseph Petrokaitis

(57) ABSTRACT

Embodiments of the invention are directed to a method of forming an integrated circuit (IC). The method includes forming a first transistor and a second transistor over a substrate. The first transistor includes a first gate structure having a first gate spacer, and the second transistor includes a second gate structure having a second gate spacer. A top portion of the first gate spacer is replaced with a first sacrificial gate spacer region, and a top portion of the second gate spacer is replaced with a second sacrificial gate spacer region. A source or drain (S/D) conductive plug trench and a S/D cap trench are formed in the dielectric region of the IC and positioned over a S/D region of the first transistor. A volume of the S/D cap trench is increased by removing the first sacrificial gate spacer region and/or the second sacrificial gate spacer region.

17 Claims, 7 Drawing Sheets

(56) References Cited

U.S. PATENT DOCUMENTS

| | | |
|---|---|---|
| 2018/0182668 A1 | 6/2018 | Xie et al. |
| 2018/0240883 A1 | 8/2018 | Chanemougame et al. |
| 2020/0152509 A1* | 5/2020 | Greene ............. H01L 21/76834 |

* cited by examiner

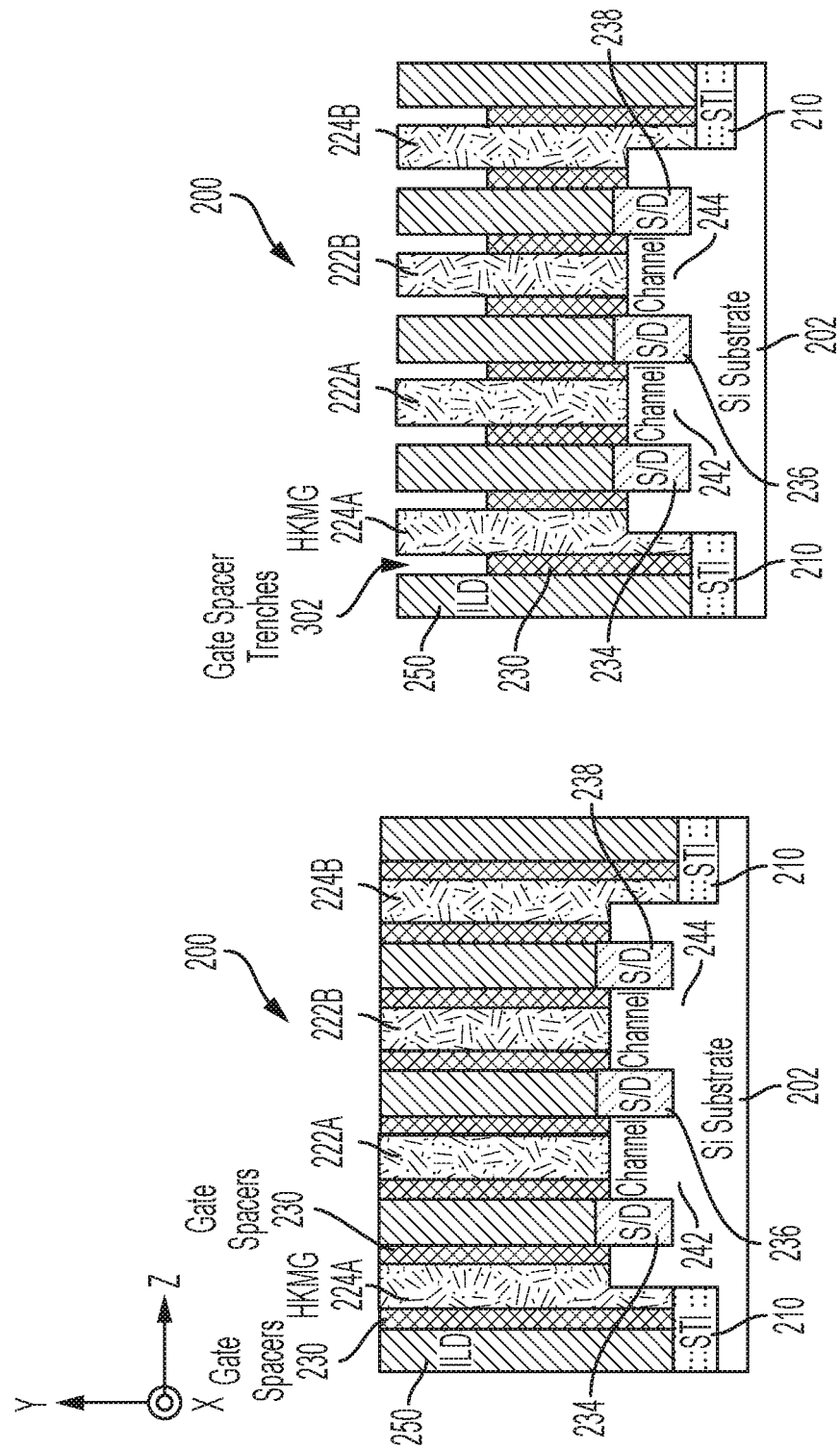

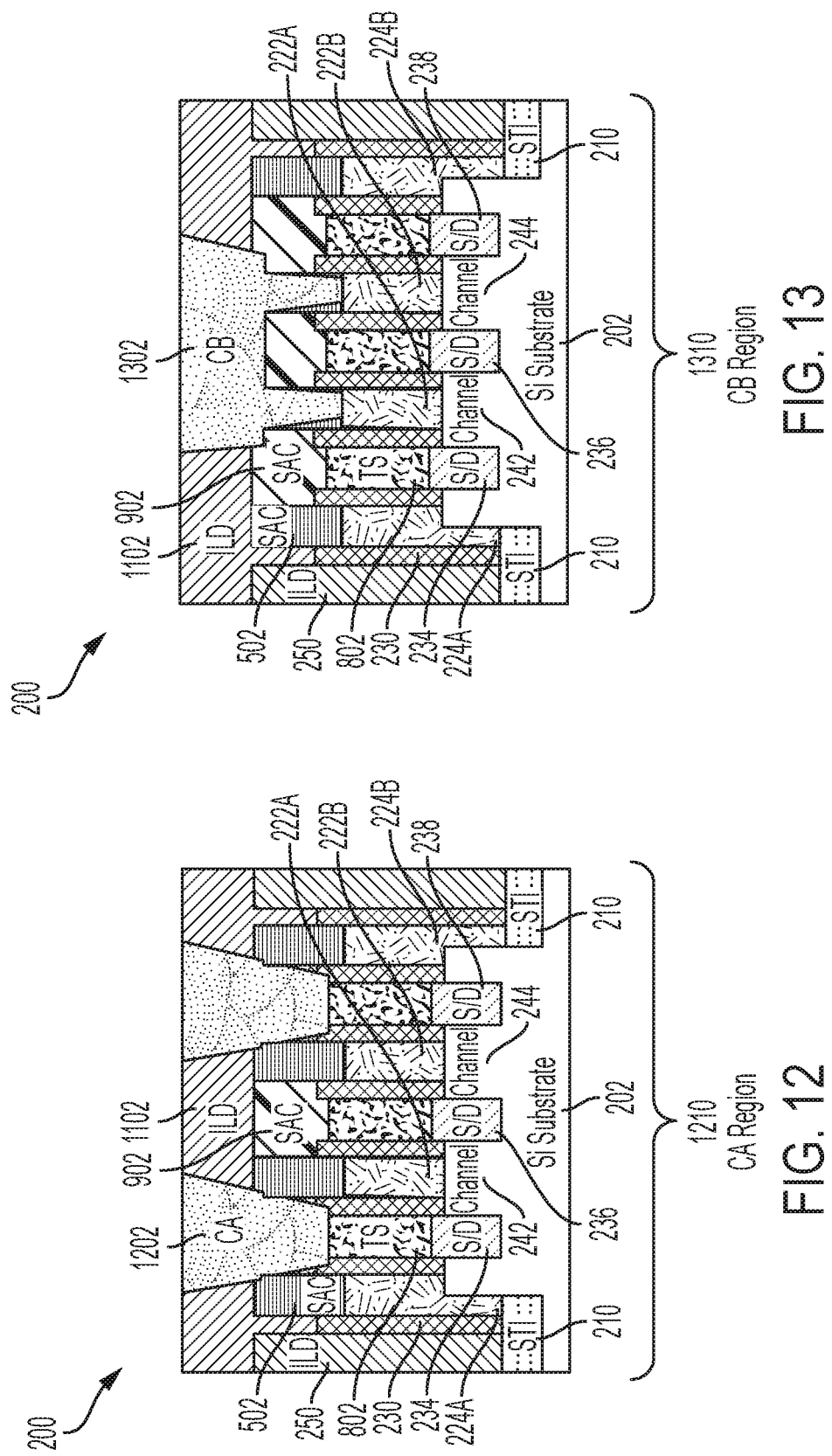

SACRIFICIAL GATE SPACER REGIONS FOR GATE CONTACTS FORMED OVER THE ACTIVE REGION OF A TRANSISTOR

BACKGROUND

The present invention relates in general to fabrication methodologies and resulting structures for semiconductor devices. More specifically, the present invention relates to the use of sacrificial gate spacer regions for gate contacts formed over the active region of a transistor, wherein the sacrificial gate spacer regions can be removed after forming the source/drain (S/D) contact trenches, thereby creating a relatively wide S/D self-aligned-cap (SAC) trench in which a robust S/D SAC can be formed.

Integrated circuits (ICs) are fabricated in a series of stages, including a front-end-of-line (FEOL) stage, a middle-of-line (MOL) stage and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, S/D regions, extension junctions, silicide regions, and liners. The MOL stage typically includes process flows for forming the contacts and other structures that communicatively couple to active regions (e.g., gate, source, and drain) of the device element. For example, the silicidation of S/D regions, as well as the deposition of metal contacts, can occur during the MOL stage to connect the elements patterned during the FEOL stage. Layers of interconnections are formed above these logical and functional layers during the BEOL stage to complete the IC.

In an integrated circuit (IC) having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. The channel region connects the source and the drain. Electrical current is induced to flow through the channel region from the source to the drain by a voltage applied at the gate electrode.

A MOSFET can have a gate contact (referred to herein as a CB contact) and S/D contacts (referred to herein as CA contacts). The gate contact can extend vertically through an interlayer dielectric (ILD) material of the IC from a metal wire or via in the first BEOL metal level (referred to herein as MO) to the gate of the MOSFET. The S/D contacts can extend vertically through the ILD material from metal wires or vias in the BEOL metal level to metal plugs (also referred to herein as trench silicide (TS) contacts), which are on the S/D regions of the MOSFET. In order to avoid shorts between the gate contact and the metal plugs, the gate contact can be formed on a portion of the gate that is offset from the active region of the FET and, more particularly, on a portion of the gate that extends laterally over the adjacent isolation region. However, given the ever present need for size scaling of devices, methods have been developed that allow for a gate contact to be formed on a portion of the gate directly above the active region (referred to herein as a CB-over-active or CBoA) or close thereto, while ensuring that the risk of a short developing between the gate contact and any of the metal plugs is avoided or at least significantly reduced.

SUMMARY

Embodiments of the invention are directed to a method of forming an integrated circuit (IC) structure. A non-limiting example of the method includes forming a first transistor over a substrate. The first transistor includes a first gate structure positioned over a first channel region. The first transistor further includes a first gate spacer formed on a sidewall of the first gate structure. A second transistor is formed over the substrate. The second transistor includes a second gate structure positioned over a second channel region. The second transistor further includes a second gate spacer formed on a sidewall of the second gate structure. A dielectric region is formed over the first transistor, the second transistor, and the substrate. A top portion of the first gate spacer is replaced with a first sacrificial gate spacer region, and a top portion of the second gate spacer is replaced with a second sacrificial gate spacer region. A source or drain (S/D) conductive plug trench and a S/D cap trench are formed in the dielectric region and positioned over a S/D region of the first transistor. A first sidewall of the S/D conductive plug trench includes the first gate spacer of the first transistor. A second sidewall of the S/D conductive plug trench includes the second gate spacer of the second transistor. A first sidewall of the S/D cap trench includes the first sacrificial gate spacer region of the first transistor. A second sidewall of the S/D cap trench includes the second sacrificial gate spacer region of the second transistor. A volume of the S/D cap trench is increased by removing the first sacrificial gate spacer region.

Embodiments of the invention are directed to an IC structure. A non-limiting example of the IC structure includes a first transistor formed over a substrate. The first transistor includes a first gate structure positioned over a first channel region. The first transistor further includes a first gate spacer formed on a sidewall of the first gate structure. The first gate structure includes a first gate cap over a first gate conductive body. The IC structure further includes a second transistor formed over the substrate. The second transistor includes a second gate structure positioned over a second channel region. The second transistor further includes a second gate spacer formed on a sidewall of the second gate structure. The second gate structure includes a second gate cap over a second gate conductive body. A dielectric region is over the first transistor, the second transistor, and the substrate. A S/D conductive plug trench and a S/D cap trench are positioned in the dielectric region and over a S/D region of the first transistor. A top surface of the first gate spacer is above a top surface of the first gate conductive body and below a top surface of the first gate cap. A top surface of the second gate spacer is above a top surface of the second gate conductive body and below a top surface of the second gate cap. A first sidewall of the S/D conductive plug trench includes the first gate spacer of the first transistor. A second sidewall of the S/D conductive plug trench includes the second gate spacer of the second transistor. A first sidewall of the S/D cap trench includes a sidewall of the first gate cap. A second sidewall of the S/D cap trench includes a sidewall of the second gate cap. A conductive plug is formed within the S/D conductive plug trench, wherein a bottom surface of the S/D cap trench includes a top surface of the first gate spacer, a top surface of the second gate spacer, and a top surface of the conductive plug.

A S/D cap is formed within the S/D cap trench, wherein a width dimension of the S/D cap is greater than a width dimension of the conductive plug.

Embodiments of the invention are directed to an IC structure. A non-limiting example of the IC structure includes a transistor formed over a substrate. The transistor includes an active gate structure positioned over a channel region formed in a fin. The transistor further includes a first gate spacer formed on a sidewall of the active gate structure. The active gate structure includes a first gate cap over an active gate conductive body. An inactive gate structure is positioned over and end region of the fin. The inactive gate structure includes a second gate spacer formed on a sidewall of the inactive gate structure. The inactive gate structure includes a second gate cap over an inactive gate conductive body. The second gate spacer includes a recessed bottom region and a replacement top region. The top replacement region of the second gate spacer includes an interlayer dielectric. A top surface of the recessed bottom region of the second gate spacer is below a top surface of the second gate cap spacer.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIGS. 2-13 depict the results of fabrication operations for forming a FinFET device having CBoA contacts with sacrificial gate spacer regions and robust S/D SAC regions in accordance with aspects of the invention, in which:

FIG. 2 depicts a cross-sectional view of a representative section of an IC after fabrication operations according to embodiments of the invention;

FIG. 3 depicts a cross-sectional view of the representative section of the IC after fabrication operations according to embodiments of the invention;

FIG. 4 depicts a cross-sectional view of the representative section of the IC after fabrication operations according to embodiments of the invention;

FIG. 5 depicts a cross-sectional view of the representative section of the IC after fabrication operations according to embodiments of the invention;

FIG. 6 depicts a cross-sectional view of the representative section of the IC after fabrication operations according to embodiments of the invention;

FIG. 7 depicts a cross-sectional view of the representative section of the IC after fabrication operations according to embodiments of the invention;

FIG. 8 depicts a cross-sectional view of the representative section of the IC after fabrication operations according to embodiments of the invention;

FIG. 9 depicts a cross-sectional view of the representative section of the IC after fabrication operations according to embodiments of the invention;

FIG. 10 depicts a cross-sectional view of the representative section of the IC after fabrication operations according to embodiments of the invention;

FIG. 11 depicts a cross-sectional view of the representative section of the IC after fabrication operations according to embodiments of the invention;

FIG. 12 depicts a cross-sectional view of the representative section of the IC after fabrication operations according to embodiments of the invention; and FIG. 13 depicts a cross-sectional view of the representative section of the IC after fabrication operations according to embodiments of the invention.

Figure 1:
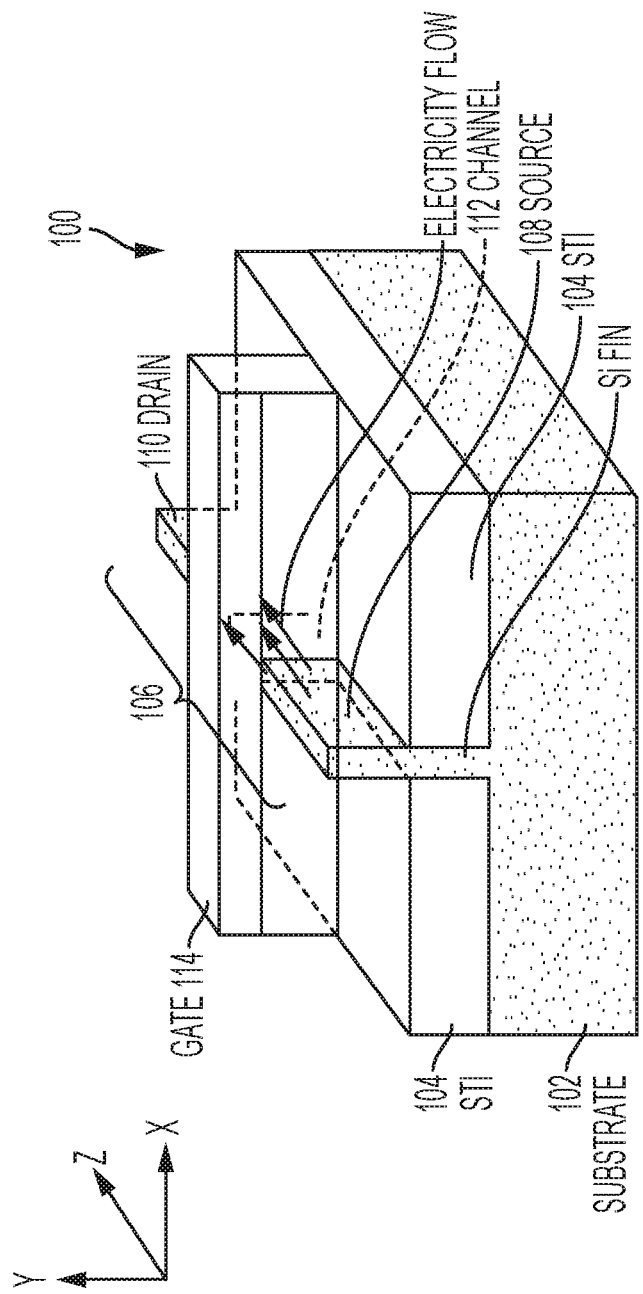
FIG. 1 depicts a three-dimensional view of an example configuration of a FinFET device capable of implementing embodiments of the invention.

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this description includes a detailed description of the formation and resulting structures for a specific type of interconnect stack in a particular type of IC device architecture (i.e., a FinFET), implementation of the teachings recited herein are not limited to a particular type of interconnect stack or IC architecture. Rather, embodiments of the present invention are capable of being implemented in conjunction with any other type of interconnect stack or IC architecture, now known or later developed. For example, embodiments of the invention are capable of being implemented with a nanosheet-based transistor.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, semiconductor devices are used in a variety of electronic and electro-optical applications. ICs are typically formed from various circuit configurations of semiconductor devices (e.g., transistors, capacitors, resistors, etc.) and conductive interconnect layers (known as metallization layers) formed on semiconductor wafers. Alternatively, semiconductor devices can be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

In contemporary semiconductor fabrication processes, a large number of semiconductor devices and conductive interconnect layers are fabricated. More specifically, during the first portion of chip-making (i.e., the FEOL stage), the individual components (transistors, capacitors, etc.) are fabricated on the wafer. The MOL stage follows the FEOL stage and typically includes process flows for forming the contacts and other structures that communicatively couple to active regions (e.g., gate, source, and drain) of the device element. For example, the silicidation of source/drain regions, as well as the deposition of metal contacts, can occur during the MOL stage to connect the individual components fabricated during the FEOL stage. In the BEOL stage, these components are connected to each other to distribute signals, as well as power and ground. The conductive interconnect layers serve as a network of pathways that transport signals throughout an IC, thereby connecting circuit components of the IC into a functioning whole and to the outside world. Because there typically isn't enough room on the chip surface to create all of the necessary connections in a single layer, chip manufacturers build vertical levels of interconnects. While simpler ICs can have just a few metal layers, complex ICs can have ten or more layers of wiring.

Interconnect structures close to the transistors need to be small because they attach/join to the components that are themselves very small and often closely packed together. These lower-level lines, which can be referred to as local interconnects, are usually thin and short in length. Global interconnects are higher up in the structure and travel between different blocks of the circuit. Thus, global interconnects are typically thick, long, and widely separated. Connections between interconnect levels (e.g., vias) allow signals and power to be transmitted from one layer to the next.

Interconnect structures are often formed in a stack. For example, a transistor can have a gate (or CB) contact and S/D (or CA) contacts. The CA contacts can extend through an interlayer dielectric (ILD) region of the IC from a metal wire or via in the BEOL metal level to metal plugs (e.g., a silicide material), which are on the S/D regions of the transistor. A conventional interconnect stack fabrication process includes the deposition of an ILD insulating material (e.g., $SiO_2$) over the transistor followed by the creation of trenches in the ILD insulating material. The trenches are positioned over the portion of the transistor (source, gate, or drain) to which electrical coupling will be made. A liner/barrier material is typically deposited within the trench, and, for S/D regions, the remaining trench volume is filled with material that will form the metal plugs using, for example, a chemical/electroplating process. The excess metal is removed to form a flat surface for subsequent processing. A self-aligned cap (SAC) layer can be deposited over the exposed top surface of the metal plug. This process is repeated until all portions of the interconnect structure stack have been formed.

For the S/D interconnect structures of non-planar FETs (e.g., a FinFET), the trench formed in the ILD region is over the S/D regions and adjacent the gate sidewall spacers of adjacent the metal gates. Thus, the gate sidewall spacers protect the metal gate from the etch process (e.g., a reactive ion etch (RIE)) that is applied in order to form the trench. The gate sidewall spacers also support some of the functionality of the trench liner that is deposited in the trench prior to forming the metal plus. However, opening the trenches causes non-uniform and asymmetric erosion in the gate sidewall spacers. The non-uniform and asymmetric erosion of the gate sidewall spacers is due to a number of factors, including, for example, the different critical dimensions of the metal plugs and overlay placement errors.

Turning now to an overview of aspects of the invention, embodiments of the invention address the problem of weakened and eroded gate sidewall spacers by replacing a top portion of the gate sidewall spacers with a sacrificial gate spacer material prior to forming first and second stacked trenches for placement of the S/D conductive plug and the S/D cap structure. The first trench is a S/D conductive plug trench, and the second trench is a S/D cap trench. The trenches are formed by opening a dielectric material (e.g., an interlayer dielectric) over the S/D region of the IC structure such that the S/D conductive plug trench is defined by a first gate sidewall spacer, a second gate sidewall spacer, and a top surface of the S/D region of the IC structure. The S/D cap trench is above the S/D conductive plug trench and has sidewalls defined by the first and second sacrificial gate sidewall spacers. In accordance with aspects of the invention, opening the dielectric material over the S/D region causes non-uniform and asymmetric erosion of the sacrificial gate sidewall spacers while the original gate sidewall spacers remain substantially intact. In accordance with aspects of the invention, a volume of the S/D cap trench is increased by selectively removing the eroded sacrificial gate spacers. A S/D conductive plug is formed in the S/D conductive plug trench, and a S/D cap structure is formed in the S/D cap trench. In accordance with aspects of the invention, because of the increased volume of the S/D cap trench that results from removing the eroded sacrificial gate sidewall spacers from the S/D cap trench, the S/D cap structure can be made more robust in that the S/D cap structure can have a width dimension that is greater than a width dimension of the S/D conductive plug. In accordance with aspects of the invention, the S/D cap structure is further made more robust in that a bottom surface of the S/D cap is over the entirety of a top surface of the first gate sidewall spacer, a top surface of the second gate sidewall spacer, and a top surface of the S/D conductive plug. Additional dielectric layers are deposited and additional trenches are formed in order to deposit therein the CA contacts and the CB contacts. The CB contacts are configured and arranged in a CBoA arrangement.

Turning now to a more detailed description of aspects of the present invention, FIG. 1 depicts a three-dimensional view of an example configuration of a FinFET device 100 capable of implementing embodiments of the invention. The basic electrical layout and mode of operation of FinFET 100 do not differ significantly from a traditional FET. FinFET 100 includes a semiconductor substrate 102, an STI layer 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on STI 104 and substrate 102. Substrate 102 can be silicon, STI 104 can be an oxide (e.g., silicon oxide), and fin 106 can be silicon that has been enriched to a desired concentration level of germanium. Gate 114 controls the source to drain current flow (labeled ELECTRICITY FLOW in FIG. 1).

In contrast to planar MOSFETs, the source 108, drain 110 and channel 112 regions are built as a three-dimensional bar on top of the STI layer 104 and the semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor.

In some FinFET architectures, raised source/drain (S/D) regions (not shown in FIG. 1) can be epitaxially grown over the S/D portions 108, 110 of the fin 106 to increase the S/D volume and provide a larger surface for interfacing S/D conductive contacts (not shown in FIG. 1) with the raised S/D region. The S/D contacts are formed on either side of the gate structure 114, which includes a conductive gate material (e.g., tungsten (W), aluminum (Al), and the like) bound at its lower portion by a dielectric liner (not shown).

FIGS. 2-13 depict a semiconductor structure 200 (e.g., a wafer) after fabrication operations for forming FinFET devices thereon in accordance with aspects of the invention. FIG. 2 depicts the semiconductor structure 200 after initial fabrication stages according to embodiments of the invention. Known fabrication operations have been used to form the semiconductor structure 200 shown in FIG. 2. A variety of fabrication operations are suitable for fabricating the semiconductor structure 200 to the stage shown in FIG. 2. Because the fabrication operations are well-known, they have been omitted in the interest of brevity. In embodiments of the invention, the structure 200 will be, after completion of the fabrication process, two in-series MOSFETs formed in/on a Si wafer/substrate 202. The substrate 202 can be made of any suitable substrate material, such as, for example, monocrystalline Si, SiGe, SiC, III-V compound semiconductor, II-VI compound semiconductor, or semiconductor-on-insulator (SOI). In the example depicted in FIG. 2, the MOSFETs are FinFET architectures having doped raised S/D regions 224A, 222A, 222B, 224A. However, as previously noted herein, embodiments of the invention are not limited to a particular type of MOSFET device or IC architecture. Rather, embodiments of the invention are capable of being implemented in conjunction with any type of planar or non-planar transistor device or IC architecture, now known or later developed, for which there is a need to form conductive CBoA and CA contacts.

In/on the substrate 202, two MOSFETs are shown coupled in series with a shared S/D region 236. The gates 224A, 224B are inactive, and the first in-series MOSFET is defined by an active gate 222A, a channel 242, a S/D region 234, and the shared S/D region 236. The second in-series MOSFET is defined by an active gate 222B, a channel 244, a S/D region 238, and the shared S/D region 236. The channel regions 242, 244 can be lightly doped or undoped Si. The active and inactive gates 222A, 222B, 224A, 224B can be implemented as a high-k metal gate (HKMG), which can be fabricated according to a known replacement metal gate (RMG) processes. The HKMG includes gate dielectric layers (not shown). In general, the gate dielectrics of the active and inactive gates 222A, 222B, 224A, 224B can include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric can further include dopants such as lanthanum, aluminum, magnesium.

The active and inactive gates 222A, 222B, 224A, 224B can include any suitable gate conductive material. The conductive material can further include dopants that are incorporated during or after deposition. In some embodiments of the invention, the active and inactive gates 222A, 222B, 224A, 224B can further include a work-function setting layer between the gate dielectric (not shown) the active and inactive gates 222A, 222B, 224A, 224B. The work-function setting layer can be a work-function metal (WFM) formed from any suitable material. In some embodiments of the invention, a conductive material or a combination of multiple conductive materials can serve as both the main conductive element and the WFM of the active and inactive gates 222A, 222B, 224A, 224B.

Gate sidewall spacers 230 are formed along sidewalls of the active and inactive gates 222A, 222B, 224A, 224B, configured and arranged as shown. The gate sidewall spacers 230 can be formed from any suitable dielectric, including, for example, SiOCN. Shallow trench isolation (STI) regions 210 include a suitable dielectric configured to electrically isolate one in-series MOSFET on the substrate 202 from another. Known fabrication operations have used to deposit an interlayer dielectric (ILD) insulating material (e.g., $SiO_2$) 210 over the semiconductor structure 200. The semiconductor structure 200 is planarized using known planarization techniques.

In FIG. 3, known semiconductor fabrication processes have been used to deposit a blocking mask or pattern (not shown) to cover the structure 200 except for selectively exposed top surfaces of the gate sidewall spacers 230. Known semiconductor fabrication processes (e.g., a reactive ion etch (RIE)) have been used to remove non-covered portions of the gate sidewall spacers 230, thereby forming gate spacer trenches 302.

Figure 4:
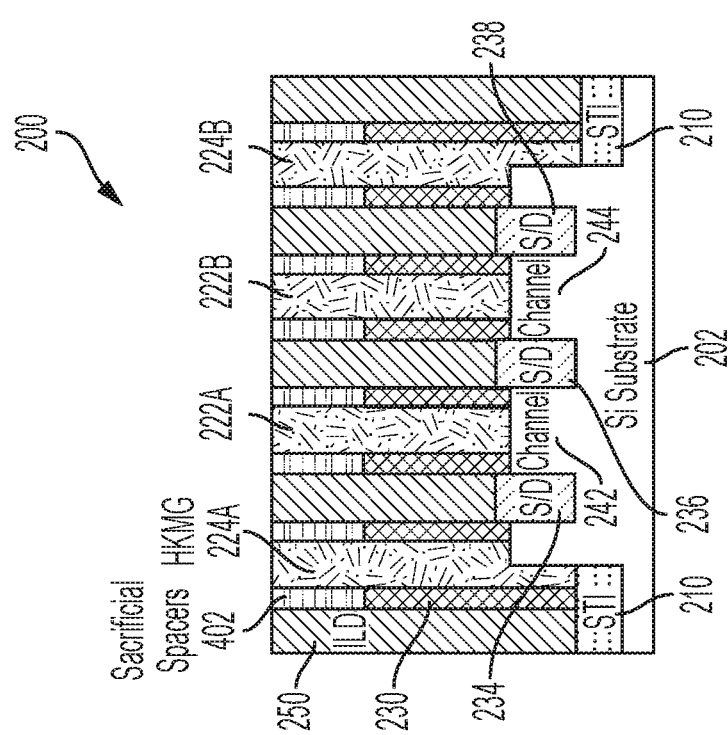

In FIG. 4, known semiconductor fabrication processes have been used to form sacrificial spacers 402 in the gate spacer trenches 302 (shown in FIG. 3). In embodiments of the invention, the sacrificial spacers 402 can be formed from any suitable material, including, for example, $TiO_x$, $AlO_x$, Si, and the like. Suitable fabrication operations for forming the sacrificial spacers 402 in the gate spacer trenches 302 include conformally depositing a layer of sacrificial spacer material on the structure 200 such that the sacrificial spacer material pinches off in the gate spacer trenches. Excess sacrificial spacer material is removed (e.g., through planarization), thereby forming the sacrificial spacers 402. The layer of sacrificial spacer material can be deposited using any suitable conformal deposition process (e.g., ALD, CVD, and the like).

Figure 5:
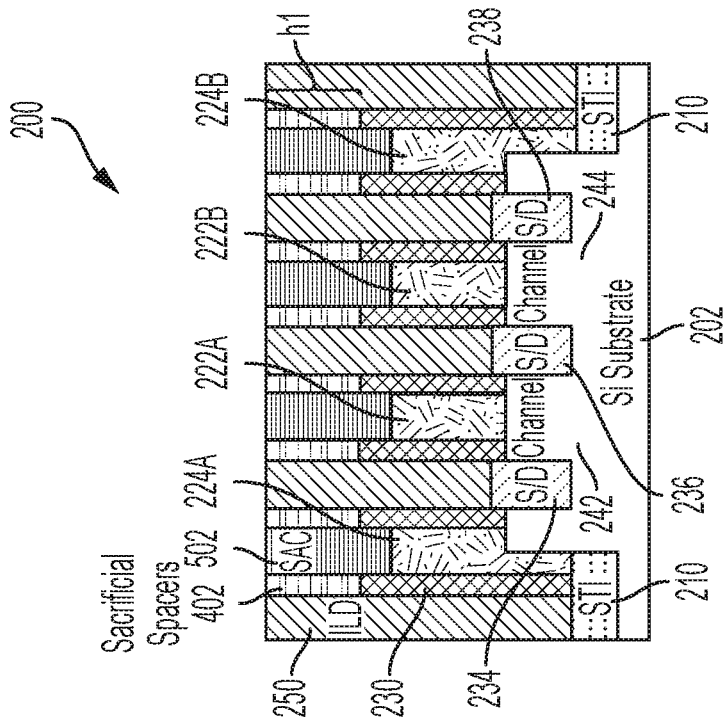

In FIG. 5, known fabrication operations have been used to recess the active and inactive gates 222A, 222B, 224A, 224B to form self-aligned cap (SAC) trenches (not shown). Known fabrication operations have also been used to form SAC structures 502 over the active and inactive gates 222A, 222B, 224A, 224B for gate protection during downstream fabrication operations. The SAC structure 502 can be any suitable dielectric material, including, for example, SiN. Suitable fabrication operations for forming the SAC structures 502 in the SAC trenches include conformally depositing a layer of SAC material on the structure 200 such that the SAC material pinches off in the SAC trenches. Excess SAC material is removed (e.g., through planarization), thereby forming the SAC structures 502. The layer of SAC material can be deposited using any suitable conformal deposition process (e.g., ALD, CVD, and the like).

Figure 6:
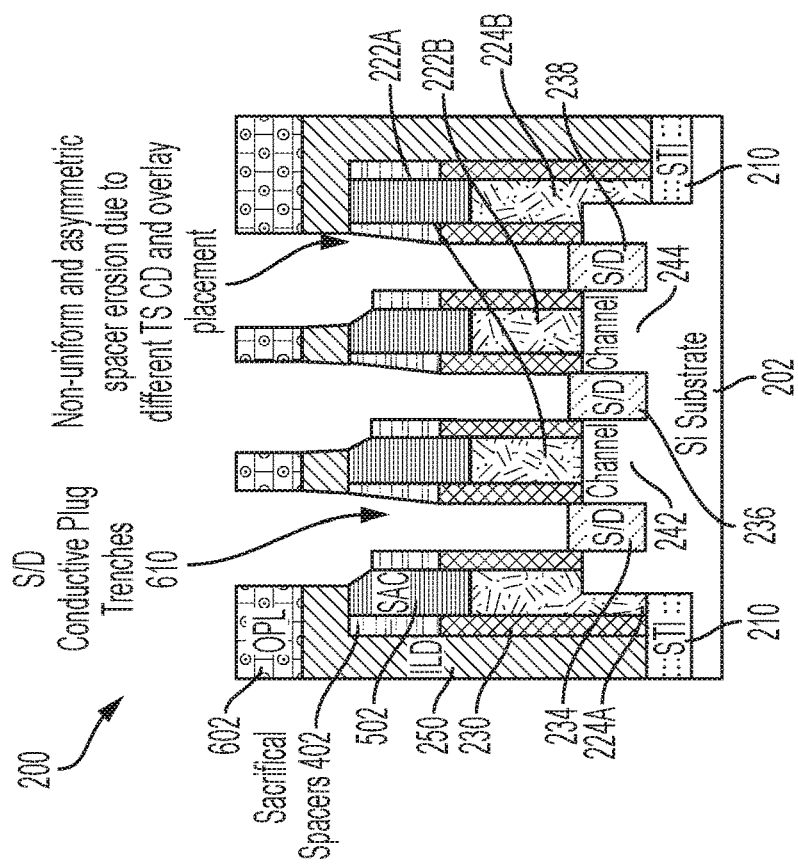

In FIG. 6, known fabrication operations have been used to deposit an organic planarization layer (OPL) 602 over the structure 200. In general, OPLs are used as etch masks for pattern transfers into inorganic substrates, to fill pre-existing features, and to planarize the substrate to allow for larger patterning process windows. Known fabrication operations are used to pattern and etch the OPL 602 and the ILD 250 over the S/D regions 234, 236, 238, thereby opening the S/D conductive plug trenches 610. After the fabrication stage depicted in FIG. 6, non-uniform and asymmetric erosion has been absorbed by the sacrificial gate sidewall spacers 402 while the gate sidewall spacers 230 have not absorbed non-uniform and asymmetric erosion and remained substantially intact. The non-uniform and asymmetric erosion is due to a number of factors, including, for example, the different critical dimensions of the metal plugs 802 (shown in FIG. 8) and overlay placement errors.

Figure 7:
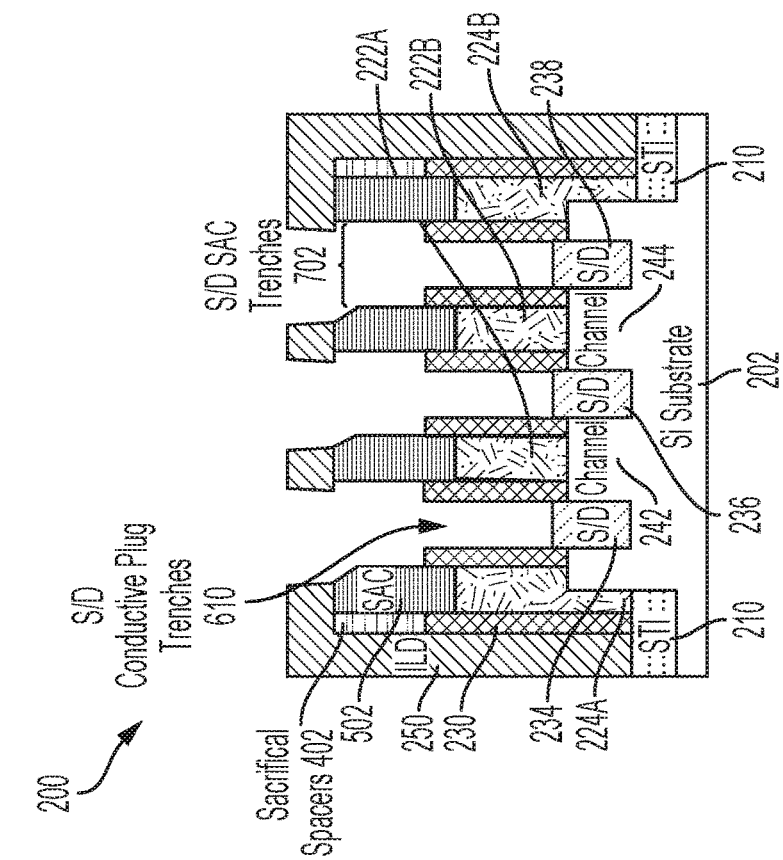

In FIG. 7, known semiconductor fabrication operations (e.g., a directional HF/HCl etch) have been used to remove the OPL 602 (shown in FIG. 6). Known semiconductor fabrication operations have also been used to remove the non-uniformly and asymmetrically eroded sacrificial gate sidewall spacers 402 from within the S/D conductive plug trenches 610, thereby forming S/D SAC trenches 702. In accordance with aspects of the invention, removal of the eroded sacrificial gate sidewall spacers 402 is facilitated by forming the sacrificial gate sidewall spacers 402 from a sacrificial spacer material having etch selectivity with respect to the SAC structures 502 and the gate sidewall spacers 230. In embodiments of the invention, the gate sidewall spacers 230 can be SiOCN, the SAC structures 502 can be SiN, and the sacrificial gate sidewall spacers 402 can be $TiO_x$, $AlO_x$, Si, and the like. In accordance with aspects of the invention, with the removal of the eroded sacrificial gate spacers 402, a width dimension of the S/D SAC trenches 702 is greater than a width dimension of the S/D conductive plug trenches 610. In some embodiments of the invention, the non-uniformly and asymmetrically eroded sacrificial gate sidewall spacers 402 can be removed from within the S/D conductive plug trenches 610 after formation of the metal plug 802 (shown in FIG. 8) to prevent gate contact to S/D contact shorts.

Figure 8:
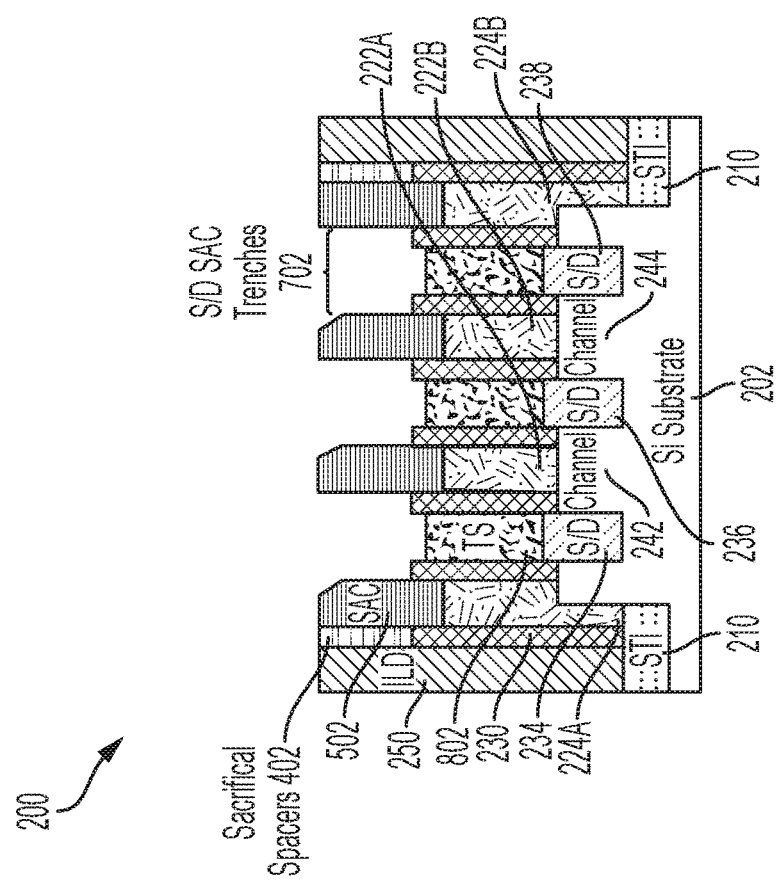

In FIG. 8, known semiconductor fabrication processes have been used to deposit and recess a metal plug fill (also known as a trench silicide (TS) material) 802 in the S/D conductive plug trenches 610. The metal plug fill 802 can include a liner (not shown). The liner can be deposited using any deposition technique suitable for the material that has been selected to form the liner. The liner serves multiple functions including, for example, functioning as a barrier to prevent metals in the metal plug material 802 from migrating out of the metal plug material 802. In embodiments of the invention, the liner can be formed from a variety of materials, including, but not limited to TiN. The metal plug material 802 can be deposited using any suitable deposition process, including, for example, a chemical/electroplating process. In embodiments of the invention, the metal plug material 802 can be formed from a variety of low resistivity silicide materials including but not limited to cobalt (Co), tungsten (W), and the like. After the fabrication operations depicted in FIG. 8, the S/D SAC trenches 702 are defined by sidewalls of the SAC 502, top surfaces of the gate sidewall spacers 230, and top surfaces of the metal plugs 802.

Figure 9:
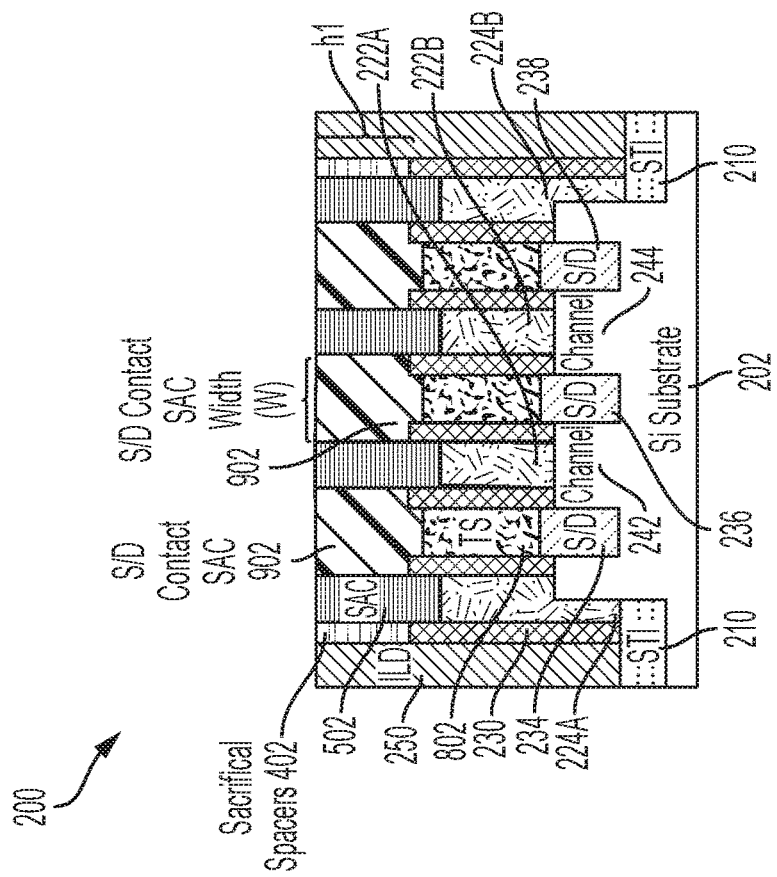

In FIG. 9, known fabrication operations have been used to form S/D contact SAC structures 902 within the S/D SAC trenches 702 for protection of the metal plugs 802 during downstream fabrication operations. The S/D contact SAC structure 902 can be any suitable dielectric material, including, for example, SiC. Suitable fabrication operations for forming the S/D contact SAC structures 902 in the S/D SAC trenches 702 (shown in FIG. 8) include conformally depositing a layer of S/D contact SAC material (e.g., SiC) on the structure 200 such that the S/D contact SAC material pinches off in the S/D SAC trenches 702. Excess S/D contact SAC material is removed (e.g., through planarization), thereby forming the S/D contact SAC structures 902. The layer of S/D contact SAC material can be deposited using any suitable conformal deposition process (e.g., ALD, CVD, and the like). In accordance with aspects of the invention, with the removal of the eroded sacrificial gate spacers 402 (shown in FIG. 6), the S/D contact SAC structures 902 are made robust in that a width dimension of each of the S/D contact SAC structures 902 is sufficient to cover the metal plugs 802 and the gate sidewall spacers 230 that are below the S/D contact SAC structures 902. After the planarization operations depicted in FIG. 9, the remaining sacrificial spacers 402 in the structure 200 have a height h1.

Figure 10:
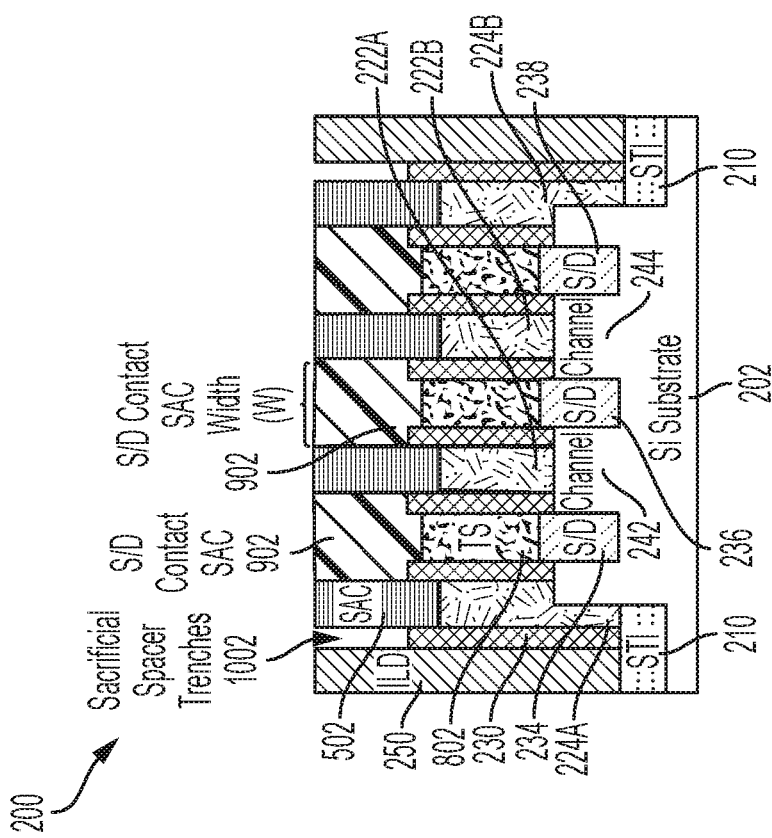

In FIG. 10, known semiconductor fabrication operations (e.g., a directional HF/HCl etch) have been used to remove the remaining sacrificial gate sidewall spacers 402 (shown in FIG. 9) from the structure 200, thereby forming sacrificial spacer trenches 1002.

Figure 11:
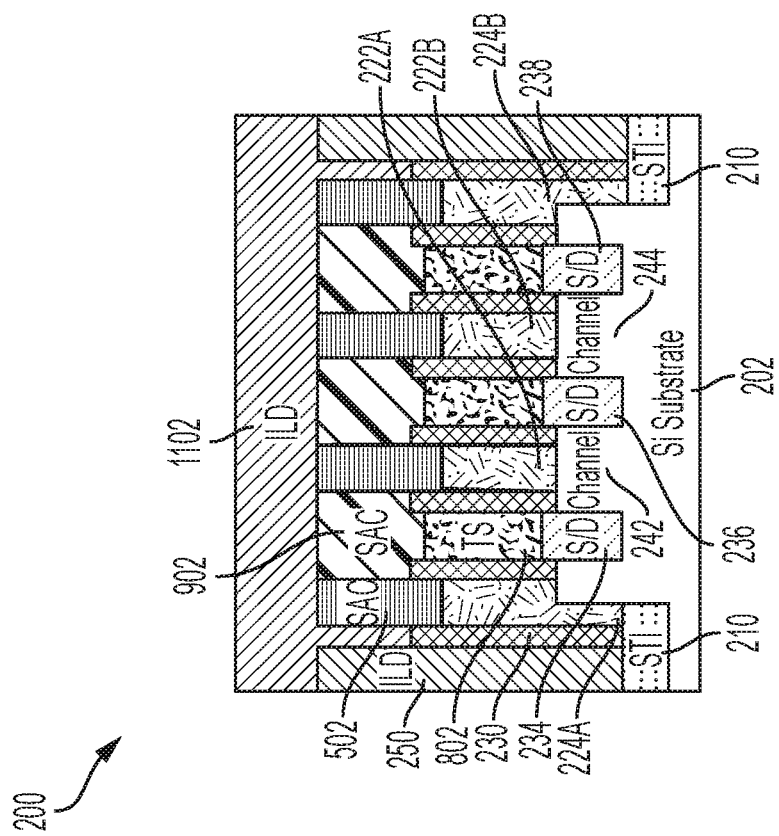

In FIG. 11, known semiconductor fabrication processes have been used to deposit and planarize a top ILD region 1102 over the structure 200, thereby filling in the sacrificial spacer trenches 1002 (shown in FIG. 10). In embodiments of the invention, the ILD region 250 and the top ILD region 1102 can be the same or different material. In some embodiments of the invention, the ILD region 250 can be formed from a variety of dielectric materials, including, but not limited to, $SiO_2$. In some embodiments of the invention, the top ILD region 1102 can be formed from a variety of low k dielectric materials, including, but not limited to, SiBCN, SiOCN, SiCN, and SiN.

FIG. 12 depicts the structure 200 showing a cross-sectional view of a CA region 1210 of the structure 200 where example CA contacts 1202 have been formed. In FIG. 12, known semiconductor fabrication processes (lithography and RIE) have been used to deposit a blocking mask (not shown) over selected portions of the top ILD 1102, and known semiconductor fabrication processes (e.g., a RIE) have been used to remove non-masked portions of the top ILD 1102 and the SAC structures 902, thereby opening a top surface of the metal plugs 802. Known fabrication operations have been used to deposit S/D CA contacts 1202 over the exposed top surfaces of the metal plugs 802. The CA contacts 1202 can include liners, which can be deposited using any deposition technique suitable for the material that has been selected to form the liners. The remaining volume above the liner is filled with the material from which the S/D CA contacts 1202 are formed using, for example, a chemical/electroplating process. In embodiments of the invention, the S/D CA contacts 1202 can be formed from a variety of low resistivity materials, including, but not limited to Cu. The excess material used to form the S/D CA contacts 1202 is removed and planarized to form a flat surface for subsequent processing.

FIG. 13 depicts the structure 200 showing a cross-sectional view of a CB region 1310 of the structure 200 where example CB contacts 1302 have been formed. In FIG. 13, known semiconductor fabrication processes (lithography and RIE) have been used to deposit a blocking mask (not shown) over selected portions of the top ILD 1102, and known semiconductor fabrication processes (e.g., a RIE) have been used to remove non-masked portions of the top ILD 1102 and the SAC structures 502, thereby opening a top surface of the active gates 222A, 222B. Known fabrication operations have been used to deposit CB contacts 1302 over the exposed top surfaces of the active gates 222A, 222B. The CB contacts 1302 are configured and arranged in a CBoA arrangement. The CB contacts 1302 can include liners, which can be deposited using any deposition technique suitable for the material that has been selected to form the liners. The remaining volume above the liner is filled with the material from which the CB contacts 1302 are formed using, for example, a chemical/electroplating process. In embodiments of the invention, the CB contacts 1302 can be formed from a variety of low resistivity materials, including, but not limited to Cu. The excess material used to form the CB contacts 1302 is removed and planarized to form a flat surface for subsequent processing.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming an integrated circuit (IC) structure, the method comprising:
   forming a first transistor over a substrate, the first transistor comprising a first gate structure positioned over a first channel region, the first transistor further comprising a first gate spacer formed on a sidewall of the first gate structure;
   forming a second transistor over the substrate, the second transistor comprising a second gate structure positioned over a second channel region, the second transistor further comprising a second gate spacer formed on a sidewall of the second gate structure;
   forming a dielectric region over the first transistor, the second transistor, and the substrate;
   replacing a top portion of the first gate spacer with a first sacrificial gate spacer region;
   replacing a top portion of the second gate spacer with a second sacrificial gate spacer region;
   forming a source or drain (S/D) conductive plug trench and a S/D cap trench positioned in the dielectric region and over a S/D region of the first transistor;
   wherein a first sidewall of the S/D conductive plug trench comprises the first gate spacer of the first transistor;
   wherein a second sidewall of the S/D conductive plug trench comprises the second gate spacer of the second transistor;
   wherein a first sidewall of the S/D cap trench comprises the first sacrificial gate spacer region of the first transistor;
   wherein a second sidewall of the S/D cap trench comprises the second sacrificial gate spacer region of the second transistor; and
   increasing a volume of the S/D cap trench by removing the first sacrificial gate spacer region.

2. The method of claim 1, wherein a bottom surface of the S/D conductive plug trench comprises a top surface of the S/D region of the first transistor.

3. The method of claim 1 further comprising further increasing a volume of the S/D cap trench by removing the second sacrificial gate spacer region.

4. The method of claim 3 further comprising forming a conductive plug within the S/D conductive plug trench, wherein a bottom surface of the S/D cap trench comprises a top surface of the first gate spacer, a top surface of the second gate spacer, and a top surface of the conductive plug.

5. The method of claim 4, wherein the conductive plug comprises a low resistivity silicide material.

6. The method of claim 5, wherein the low resistivity silicide material comprises cobalt.

7. The method of claim 4 further comprising, subsequent to removing the first sacrificial gate spacer region and removing the second sacrificial gate spacer region, forming a S/D cap within the S/D cap trench.

8. The method of claim 7, wherein a width dimension of the S/D cap is greater than a width dimension of the conductive plug.

9. The method of claim 7, wherein a bottom surface of the S/D cap is over an entirety of a top surface of the first sidewall.

10. The method of claim 9, wherein a bottom surface of the S/D cap is over an entirety of a top surface of the second sidewall.

11. The method of claim 10, wherein a bottom surface of the S/D cap is over an entirety of a top surface of the conductive plug.

12. The method of claim 7 further comprising replacing a top portion of the first gate structure with a first gate cap.

13. The method of claim 12 further comprising replacing a top portion of the second gate structure with a second gate cap.

14. The method of claim 13, wherein:

subsequent to replacing the top portion of the first gate structure with the first gate cap, replacing the top portion of the second gate structure with the second gate cap, replacing the top portion of the first gate spacer with the first sacrificial gate spacer region, and replacing the top portion of the second gate spacer with the second sacrificial gate spacer region;

a bottom surface of the S/D cap trench comprises a top surface of the first gate spacer, a top surface of the second gate spacer, and a top surface of the conductive plug;

a first sidewall of the S/D cap trench comprises a sidewall of the first gate cap; and a second sidewall of the S/D cap trench comprises a sidewall of the second gate cap.

15. The method of claim 14 further comprising forming a second dielectric region over the first transistor, the second transistor, the dielectric region, and the substrate.

16. The method of claim 15 further comprising exposing a top surface of the conductive plug.

17. The method of claim 16 further comprising exposing the top surface of the conductive plug by forming a S/D contact trench over the top surface of the conductive plug, wherein forming the S/D contact trench comprises forming an opening extending through the second dielectric region and the S/D cap.

* * * * *